United States Patent
Afzali-Ardakani et al.

(10) Patent No.: US 9,087,851 B2
(45) Date of Patent: Jul. 21, 2015

(54) SILICON-BASED ELECTRONICS WITH DISABLING FEATURE

(71) Applicant: International Business Machines Corporation, Armonk, NY (US)

(72) Inventors: Ali Afzali-Ardakani, Ossining, NY (US); Bahman Hekmatshoartabari, White Plains, NY (US); Ali Khakifirooz, Mountain View, CA (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 113 days.

(21) Appl. No.: 13/900,204

(22) Filed: May 22, 2013

(65) Prior Publication Data
US 2014/0346685 A1    Nov. 27, 2014

(51) Int. Cl.
*H01L 27/12* (2006.01)
*H01L 23/00* (2006.01)
*H01L 21/84* (2006.01)

(52) U.S. Cl.
CPC ............ *H01L 23/576* (2013.01); *H01L 23/573* (2013.01); *H01L 21/84* (2013.01); *H01L 27/1203* (2013.01)

(58) Field of Classification Search
CPC .............................. H01L 27/1203; H01L 21/84
USPC ................... 257/347, 787, E21.502, E21.499, 257/E27.112, E21.409, E29.255; 438/126, 438/127, 311
See application file for complete search history.

(56) References Cited

U.S. PATENT DOCUMENTS

| | | |
|---|---|---|
| 3,609,741 A | 9/1971 | Miller et al. |
| 5,248,734 A | 9/1993 | Ober et al. |
| 5,712,641 A | 1/1998 | Casabona et al. |
| 8,223,677 B2 | 7/2012 | McCamon |
| 8,247,261 B2 | 8/2012 | Bedell et al. |
| 2007/0190740 A1* | 8/2007 | Furukawa et al. ............ 438/423 |
| 2008/0036002 A1 | 2/2008 | Kishiro et al. |

(Continued)

FOREIGN PATENT DOCUMENTS

| | | |
|---|---|---|
| EP | 0875344 | 11/1998 |
| WO | 97/24765 | 7/1997 |
| WO | 2008089354 | 7/2008 |

OTHER PUBLICATIONS

Darvin Edwards, "Semiconductor and IC Package Thermal Metrics", SPRA953B—Jul. 2012.

(Continued)

*Primary Examiner* — Khiem D Nguyen
(74) *Attorney, Agent, or Firm* — Louis J. Percello; Otterstedt, Ellenbogen & Kammer, LLP

(57) ABSTRACT

Silicon-based circuitry is dissolved or otherwise disabled in a controlled manner by reactive materials provided beneath the insulating layer on which the circuitry is formed. Heat and/or light induced acid generating materials are provided for corroding one or more circuitry components. Additionally and/or alternatively, gas-producing materials are deposited in compartments beneath the insulating layer. The gas-producing materials cause pressure to rise within the compartments, damaging the chip. Chemical reactions within the chip may be facilitated by heating elements and/or light generating elements embedded within the chip and actuated by triggering circuits.

10 Claims, 12 Drawing Sheets

(56) References Cited

U.S. PATENT DOCUMENTS

| | | | |
|---|---|---|---|
| 2009/0045461 A1* | 2/2009 | Droes et al. | 257/347 |
| 2011/0062981 A1 | 3/2011 | Lazaravich et al. | |
| 2012/0187351 A1 | 7/2012 | Ito et al. | |
| 2012/0286355 A1 | 11/2012 | Mauder et al. | |
| 2012/0292700 A1* | 11/2012 | Khakifirooz et al. | 257/347 |
| 2012/0302676 A1 | 11/2012 | Oya et al. | |
| 2014/0103957 A1* | 4/2014 | Fritz et al. | 326/8 |

OTHER PUBLICATIONS

Dr. Lynn Fuller, "Reliability of Integrated Circuits and Semiconductor Devices", Nov. 27, 2003.

Gordon E. Moore, "Cramming more components onto integrated circuits" Electronics, vol. 38, No. 8, Apr. 19, 1965.

Suk-Won Hwang, "A Physically Transient Form of Silicon Electronics", Science, vol. 337, pp. 1640-1644, Sep. 28, 2012.

\* cited by examiner

SILICON-BASED ELECTRONICS WITH DISABLING FEATURE

FIELD

The present disclosure relates to the physical sciences, and, more particularly, to electronic structures including integrated circuits, mechanisms for disabling such circuits, and methods of fabrication thereof.

BACKGROUND

Silicon-based integrated circuits and other electronic devices are usually intended to function indefinitely. Certain applications, however, could possibly benefit from the ability to disable such devices. Organic based circuits have been designed that are transient under controlled conditions.

SUMMARY

An exemplary fabrication method is provided in accordance with the principles of the present disclosure. Such a method includes obtaining a structure including a semiconductor layer, an electrically insulating layer, and a substrate layer, the semiconductor layer comprising silicon and adjoining the insulating layer. Electronic circuitry including a plurality of electrical components is formed on the semiconductor layer. The substrate layer is removed, thereby exposing a bottom surface of the insulating layer. The method further includes depositing a chemically reactive layer in adjoining relation to the bottom surface of the insulating layer. The chemically reactive layer is corrosive to at least one of the electrical components, capable of generating a material corrosive to at least one of the electrical components upon activation, or capable of generating gas upon activation. An encapsulation layer is formed over the chemically reactive layer.

A structure provided in accordance with the principles expressed herein includes a semiconductor layer comprising silicon and an electrically insulating layer having a top surface and a bottom surface. The semiconductor layer adjoins the top surface of the insulating layer. Electronic circuitry including a plurality of electrical components is on the semiconductor layer of the structure. A chemically reactive layer adjoins the bottom surface of the insulating layer. The chemically reactive layer is corrosive to one or more of the electrical components comprising the electronic circuitry or capable of generating a material corrosive to at least one of the electrical components upon activation. An encapsulation layer is provided over the chemically reactive layer.

A further structure includes a semiconductor layer comprising silicon and an electrically insulating layer having a top surface and a bottom surface. The semiconductor layer adjoins the top surface of the insulating layer. Electronic circuitry including a plurality of electrical components is on the semiconductor layer. A chemically reactive layer sensitive to temperature and/or light adjoins the bottom surface of the insulating layer, the chemically reactive layer generating gas when activated. One or more compartments adjoin the insulating layer, the chemically reactive layer being within the one or more compartments.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Semiconductor structures and fabrication methods as disclosed herein can provide substantial beneficial technical effects. For example, one or more embodiments may provide one or more of the following advantages:
Disabling and/or dissolving of integrated circuit components;
Robust performance using standard CMOS processing and materials;
Ability to control device and/or disabling features remotely.

These and other features and advantages will become apparent from the following detailed description of illustrative embodiments thereof, which is to be read in connection with the accompanying drawings.

DETAILED DESCRIPTION

Silicon based CMOS structures are disclosed that provide for the controlled disablement and/or elimination of the electronic systems therein. Exemplary structures include embedded heating elements and/or light emitting elements to trigger and or otherwise facilitate chemical reactions responsible for disabling and/or dissolving one or more major components (for example, channel material, dielectrics, and/or metal interconnects) of a chip. Mass production of the structures is highly feasible.

Figure 1:
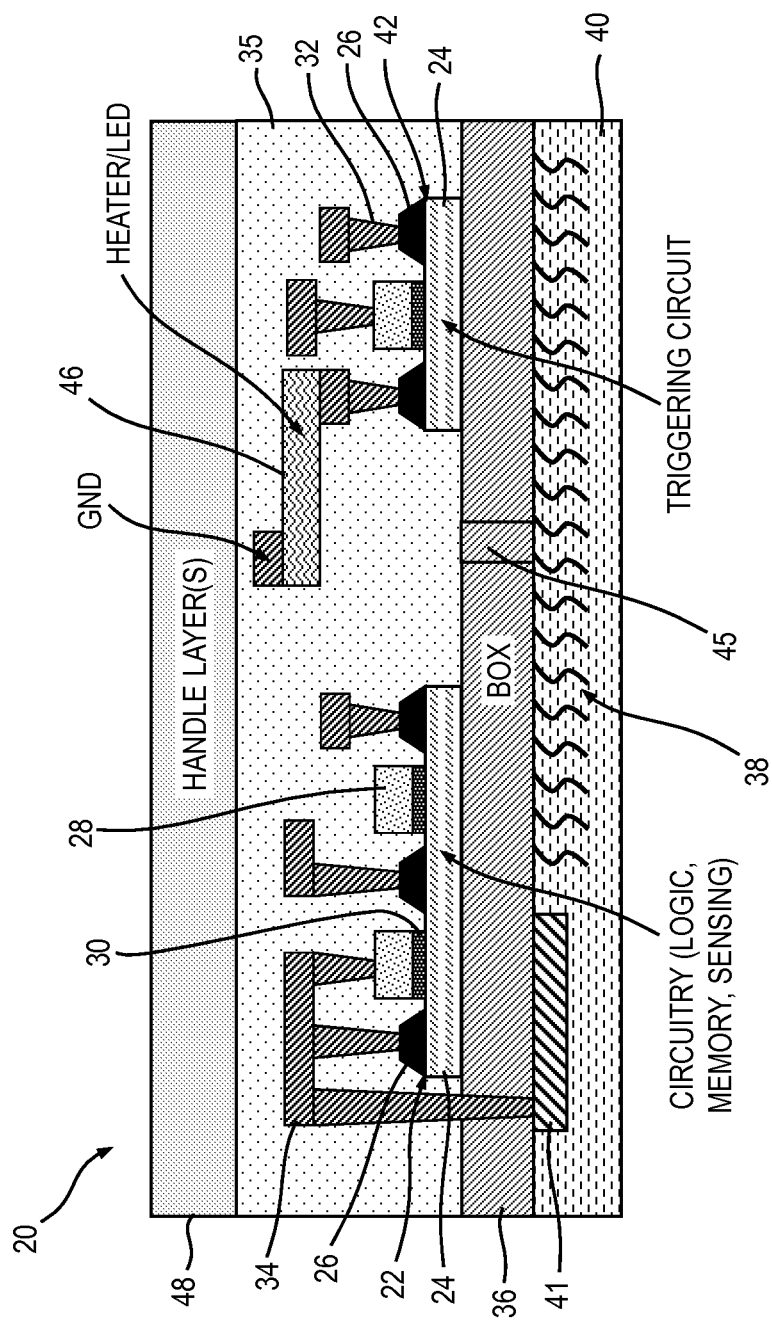
FIG. 1 is a schematic sectional view of a first exemplary structure.

A first exemplary structure 20 is shown in FIG. 1. The structure includes electronic circuitry 22 that, in one or more exemplary embodiments, comprises an integrated circuit (IC). In other words, the electronic circuitry may include an assembly of electronic components, fabricated as a monolithic unit, in which active and passive devices and their interconnections are formed on a thin layer 24 of semiconductor material. The resulting circuit may perform one or more functions (e.g. logic, memory, sensing) depending on the arrangement of the components. For purposes of illustration, raised source/drain regions 26, gate structures 28 and gate dielectrics 30 comprising MOSFET devices are shown on the layer 24 of semiconductor material in FIG. 1. Via conductors 32 and electrical connectors 34 connect the circuit components. The via conductors 32 and electrical connectors are typically copper or aluminum. A dielectric layer 35 encases the circuitry and associated connectors. Materials such as silicon dioxide may be used to form the dielectric layer. The dielectric layer and metal layers are ordinary formed during back end of line (BEOL) CMOS processing. One or more handle layers 48 adjoin the dielectric layer. An electrically insulating layer 36 such as a buried oxide (BOX) layer adjoins the circuitry layer. The insulating layer comprises silicon dioxide in one or more embodiments. A layer 38 of acid or, alternatively, base forming chemical(s) adjoins the insulating layer 36. The layer 38 is activated by heat and/or light in some embodiments, as discussed further below. An encapsulating layer 40 adjoins the chemical layer 38. The encapsulating layer employed in one or more embodiments includes a metal coating or other appropriate coating to protect the chemical layer 38 from light or other electromagnetic radiation that could cause its activation. An antenna 41 is provided within the structure 20 for transmitting and/or receiving signals. The electronic circuitry 22 and/or a triggering circuit 42 may be responsive to signals received by the antenna. A via conductor is shown extending between the electronic circuitry and the antenna. The via conductor extends through the insulating layer 36. As discussed below, additional filled openings 45 or plugs may extend through the insulating (BOX) layer 36. Such conduits may, but do not necessarily have any electrical function. The BOX layer may, for example, be comprised of high-k dielectrics that usually tend to dissolve very slowly in, for example, HF. In case of multi-layer BOX layers comprising high-k materials, the plugs in some embodiments are comprised of $SiO_2$. In general, in case a reactive chemical(s) incorporated in the structure is ineffective for etching the BOX layer, plugs comprised of sacrificial material are provided that dissolve more effectively than the BOX layer itself using the provided transience chemistry. For example, the shallow trench isolation (STI) regions can serve as plugs, which provide small plugs with high density. The horizontal dimensions of the STI regions depend on the ground rule of the CMOS technology and varies from one to another. The formation of STI regions is well known to those of skill in the art of CMOS technology. STI regions could, for example, comprise silicon dioxide in some embodiments or polysilicon in other embodiments.

The structure 20 includes a triggering mechanism that comprises a triggering circuit 42 electrically connected to a heating element and/or a light emitting diode 46. Numeral 46 is employed to designate one and/or both structures, it being understood that in some embodiments only heat is capable of being generated to facilitate chemical activation, in other embodiments only light is generated for chemical activation, and that both heat and light may be generated in other embodiments. The triggering circuit in the illustrated embodiment comprises a MOSFET device, though persons of skill in the art will appreciate that JFET devices, diodes, or other devices may alternatively be employed. While only one heating element/LED is shown, additional heating elements, LEDs and triggering mechanisms are provided as necessary to heat and/or illuminate the chip to activate the chemical layer 38. The heating elements in some embodiments comprise filaments, e.g. titanium nitride, tantalum nitride. In some embodiments, the heating elements 46 comprise reactive materials such as nickel/aluminum or palladium/aluminum. An exothermic reaction is produced when a current is passed through such reactive materials. If filaments are employed, a relatively large current is required to generate sufficient heat. The current requirements for heating elements comprised of reactive materials are substantially less.

In normal operation, the electronic circuit 22 functions in accordance with its intended purposes and the triggering circuit 42 is inactive. While the circuit generates heat, it is not sufficient to raise the chip temperature such that the heat-sensitive chemical layer 38 is activated. The circuit 22 remains functional so long as the triggering circuit(s) does not cause the heating element(s) to raise the temperature of the chip above the threshold necessary to cause the temperature-sensitive chemical layer to react and form acid(s) and/or the lighting element(s) to cause a chemical reaction in embodiments wherein light-sensitive materials are employed. The generation of, for example, acid(s) by this layer 38 causes the circuit 22 to be at least disabled, if not entirely dissolved. The acid(s) etch the oxide and/or metal components of the circuit 22, rendering it inoperable. The triggering circuit is remotely activated by means of the antenna in one or more embodiments. In some embodiments, a timer is employed that activates the triggering circuit after a predetermined period. In some embodiments, the triggering circuit is activated in response to a sensor that detects a certain condition. Metal via conductors or plugs 45 comprising sacrificial material extending through the insulating (BOX) layer, as shown only in FIG. 1, facilitate etching one or more components of the circuit 22.

In one or more alternative embodiments, the chemical layer 38 comprises a base such as potassium hydroxide (KOH). If employed, KOH should be hermetically sealed as it can absorb water and cause unwanted chip corrosion. Though not heat activated, heat facilitates its reactivity with certain chip components. KOH dissolves silicon dioxide and silicon only slowly at room temperature. Potassium hydroxide etches silicon and silicon dioxide, which is sufficient to cause the circuit 22 to be disabled. In embodiments employing a KOH chemical layer beneath the insulating layer, poly-Si plugs 45 are employed in some embodiments. If a multi-layer insulating layer is employed, silicon dioxide plugs may be employed.

In some embodiments including certain acid forming materials, exposure to light of appropriate wavelength is sufficient to cause the formation of strong acids from the chemical layer 38. Triarylsulfonium salts such as triphenylsulfonium trifluoromethanesulfonate, dispersed in a water absorbing polymer such as polyvinyl alcohol (PVA) or polyvinylpyrrolidone, are exemplary materials that can etch oxides or metals such as copper and aluminum following either exposure to light within a certain frequency range or heat above a threshold temperature. Those of skill in the art are familiar with such materials, which are used in dilute concentrations for semiconductor fabrication processes such as photolithography. As employed in the structures discussed herein, they are highly concentrated and provided in sufficient quantity such that enough material will be etched to at least disable the circuit 22. Triarylsulfonium salts are also amenable to processing that allows the activation frequency range to be adjusted in the ultraviolet (UV) range, the visible light spectrum and infrared. The structure 20 may include both heating elements and light generating elements where two modes for causing chemical reactions for disabling the circuit 22 are desired. The compound(s) comprising chemical layer 38 are stable at the normal operating temperatures of the chip with which they are associated and should also be stable at anticipated environmental temperatures. The threshold temperature for causing acid-forming reactions is between 100-200° C. in one or more exemplary embodiments. Other exemplary acid generating compounds include iodonium, phosphonium and pyridinium salts. The chemical layer 38 may include more than one type of salt in some embodiments.

Figure 2:
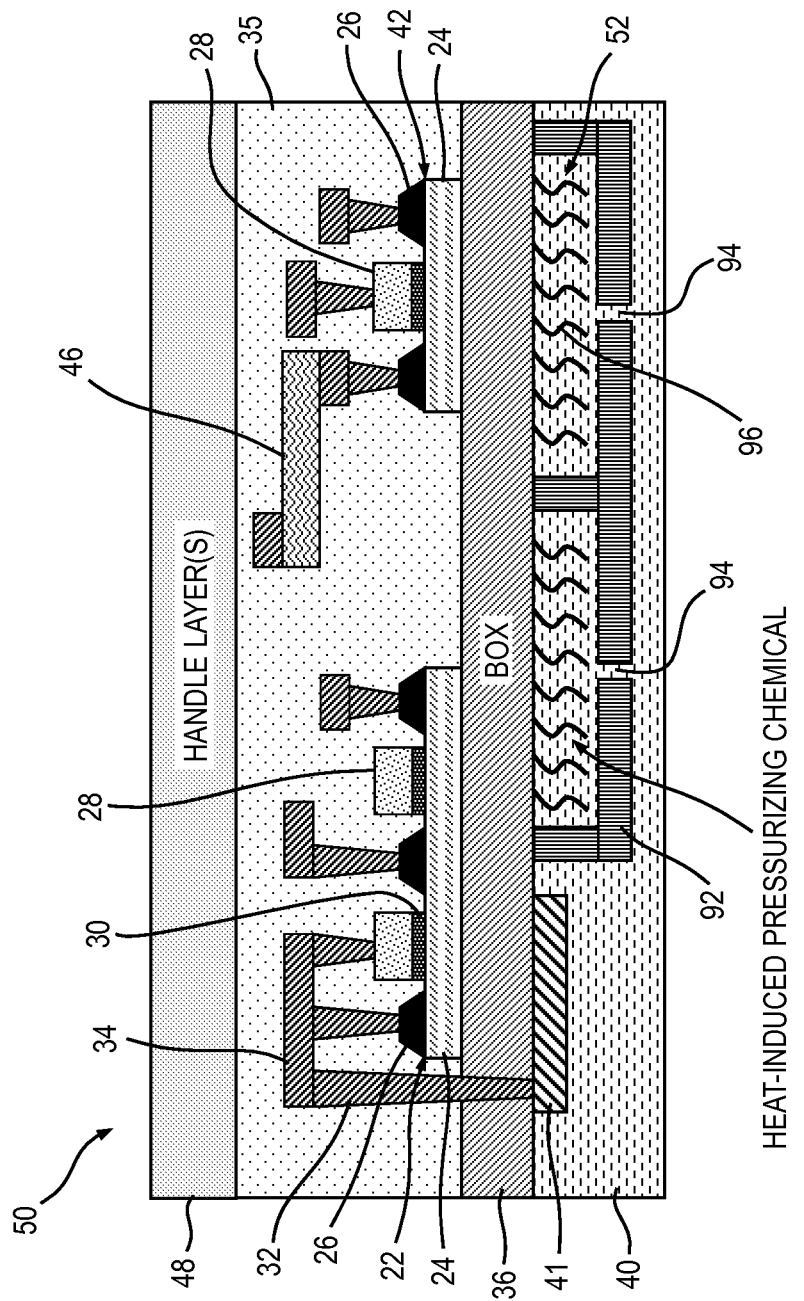
FIG. 2 is a schematic sectional view showing a second exemplary structure.

An exemplary chip structure 50 in accordance with a second embodiment is schematically illustrated in FIG. 2. This structure includes many of the same elements as the structure 20 shown in FIG. 1. Specifically, the insulating (BOX) layer and elements above the BOX layer are the same as shown in FIG. 1. The same reference numerals are employed to designate such elements. The discussion of the elements above the BOX layer with respect to FIG. 1 is accordingly applicable to the structure 50 shown in FIG. 2. The mechanism for disabling and/or destroying at least the circuit 22 incorporated within the structure 50 involves shattering the chip, though either structure 20, 50 may be designed to provide both shattering and etching mechanisms. The structure 50 includes one or more compartments 52 that adjoin the insulating layer 36. The compartments contain chemicals 96 that, when subject to a sufficient amount of heat, cause the generation of gases therein. As the gases are substantially confined by the compartments, the pressure generated within the compartments causes them to shatter, thereby destroying the functionality of the chip.

The mechanism(s) for the disabling and/or destruction the chip structures 20, 50 is accordingly based on at least one of two phenomena in one or more embodiments:

a) formation of strong corrosive acids from photo and/or thermal acid generators that etch oxides and/or metals, and/or b) formation of high volumes of gases due to generation of acids in closed compartments to cause shattering of the chip.

These two events can simultaneously occur by a composite of acid generators in a polymer which causes the production of one or more gases. Both the acid generators and gas forming polymers are well known in the semiconductor fabrication art and in combination have been used in lithography. Examples of acid generators used in electronic industry are triarylsulfonium and diaryl iodonium salts. The gas generating polymers are also well know both as "porogens" used to form porous polymer thin films and acid sensitive polymers which lose their protecting groups to form gases. In the following equations, formation of acids and gases from aforementioned composite are illustrated.

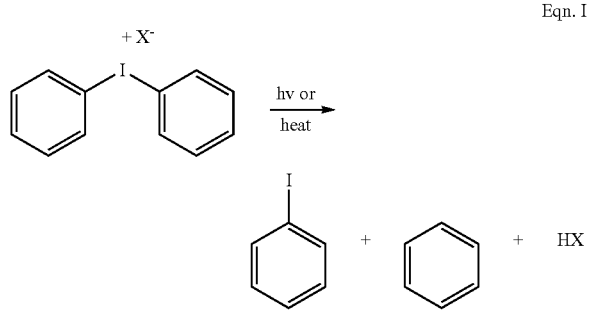

Eqn. I

The anion X in the above equation could be chosen to form desired acids like HF, HCl CF3SO3H, H2SO4, HNO3, etc. Depending on the nature of dielectric oxide, the type of the anion and hence the acid is chosen. For example, if the dielectric layer 34 is silicon oxide, the anion in the exemplary embodiment is chosen from hexafluorophosphate (PF6) or fluoride which in both cases forms hydrofluoric acid that can dissolve silicon oxide effectively. The gas forming polymer chosen in the exemplary embodiment is one which has been extensively studied and used for positive tone resists, namely, partially protected poly(hydroxystyrene) with tert-butyloxy-carbonyl (or BOC). Upon treatment with strong acids at moderately high (100-120° C.) temperatures, the BOC protecting group dissociates to one molecule of carbon dioxide and one molecule of isobutylene and leaves behind deprotected poly(hydroxystyrene) as illustrated in equation II.

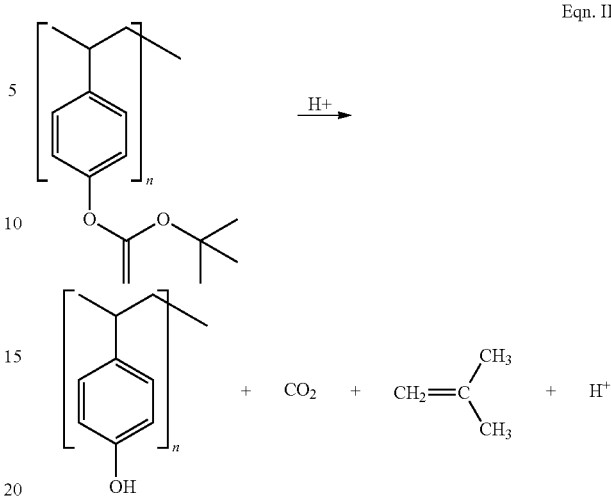

Eqn. II

Note that in the above equation the acid is used as a catalyst and after deprotection another mole of acid is regenerated.

Other exemplary acid generators include triarylsulfonium salts, which also can be used, although diaryliodonium salts have the benefit of decomposing at lower temperature (ca. 220° C.) than sulfonium salts. The polymer is used as a carrier for thin film coating of the acid generator and is used from 10% by weight to up to 90% by weight of the acid generator.

Assuming 1 mm$^2$ area for the chip, and 90% weight loading of the acid generator, each micrometer thickness of the destructive layer can generate approximately $2 \times 10^{-5}$ mmole of the acid in addition to $2 \times 10^{-5}$ mmole of each carbon dioxide and isobutylene. It is possible to produce composites containing a mixture of different acid generators to engineer the dissolution of various materials or accelerate the etch rates. For example mixture of HCl:HF provides a faster etch rate of SiO$_2$ as compared to HF alone. A combination of HNO$_3$:HF will dissolve silicon while HF alone does not etch silicon.

The specific materials discussed above should be considered exemplary as other combinations of materials may be effective for disabling or destroying the chip. Polymer composites containing inorganic porogens such as alkali azides and carbonates may be employed in some embodiments.

Figure 3:
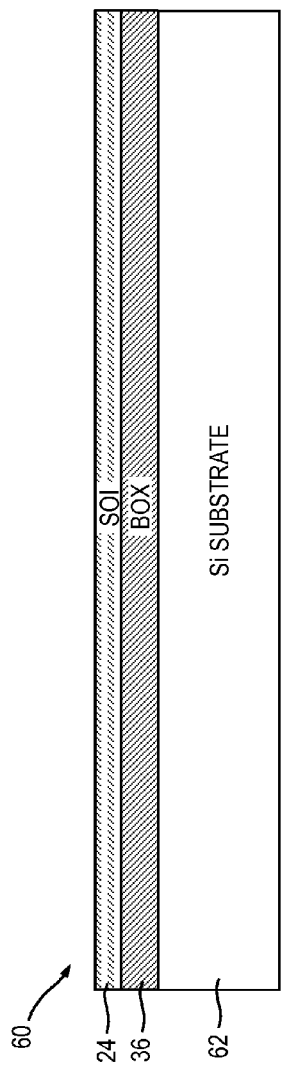
FIGS. 3-10 are schematic sectional views showing exemplary steps for fabricating the first exemplary structure.

FIGS. 3-10 schematically illustrate exemplary fabrication steps that can be employed in the manufacture of the structure 20 depicted in FIG. 1. Referring to FIG. 3, an extremely thin semiconductor on insulator (ETSOI) wafer or a semiconductor on insulator (SOI) wafer 60 is obtained. In one exemplary embodiment, the wafer 60 includes a silicon substrate 62, a buried oxide (BOX) layer 34, and a semiconductor (SOI) layer 24. The buried oxide layer comprises silicon dioxide in one or more embodiments. The semiconductor layer comprises pure crystalline silicon in some embodiments. Silicon germanium is an alternative semiconductor material that may be used as the semiconductor layer in other embodiments. The insulating (BOX) layer 34 has a thickness between 5 nm-3 μm, it being understood that the insulating layer 34 may comprise two or more dielectric layers, one being SiO$_2$ and another being a high-k material. SOI and ETSOI wafers are commercially available, and their fabrication is well known to those of skill in the art.

Figure 4:
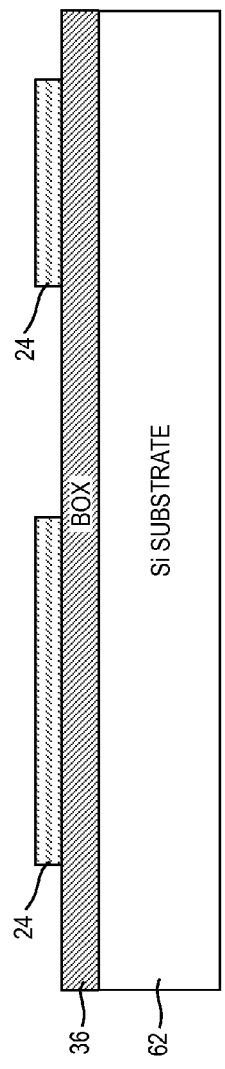
Figure 5:
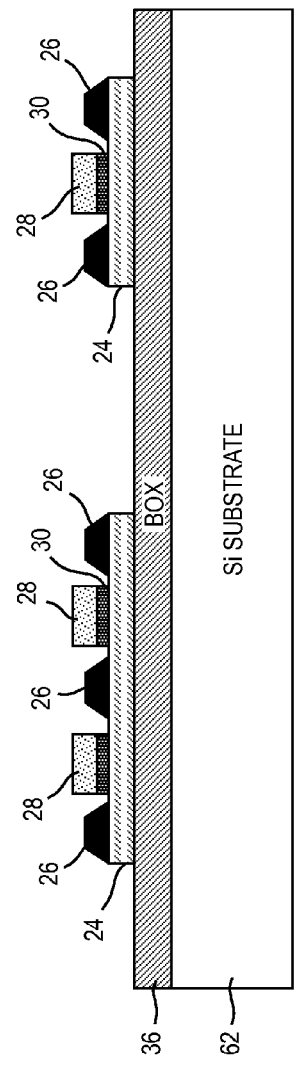

The wafer 60 is subjected to a device isolation process wherein portions of the semiconductor layer 24 are removed to form "islands" defining the device active regions as shown in FIG. 4. The areas between the active regions are filled with a dielectric material such as silicon dioxide. Openings for plugs (not shown in FIG. 3) may be formed in the insulating layer 36 following device isolation using patterning and etching techniques such as reactive ion etching (RIE) familiar to those knowledgeable in the art. Referring to FIG. 5, conventional CMOS fabrication technology is employed to provide gate stack 28 and spacer 30 formation. Source/drain formation on the semiconductor layer results in raised source drain (RSD) regions 26 in one or more exemplary embodiments where MOSFET devices are to be provided. Boron doped silicon germanium RSD regions may be formed to provide pFET devices while phosphorus doped Si:C RSD regions may be formed to provide nFET devices. It will be appreciated that the circuitry layer 22 may include silicon as well as III-V materials depending on its intended function. For example, indium gallium phosphide is incorporated within some RF transistors. Chemical vapor deposition (CVD) is among the known techniques for depositing materials on silicon during CMOS fabrication. Silicide formation is employed in some embodiments to form contacts to various device electrodes. The elements of the triggering circuit 42 are formed in the same manner as the circuitry layer 22.

Figure 6:
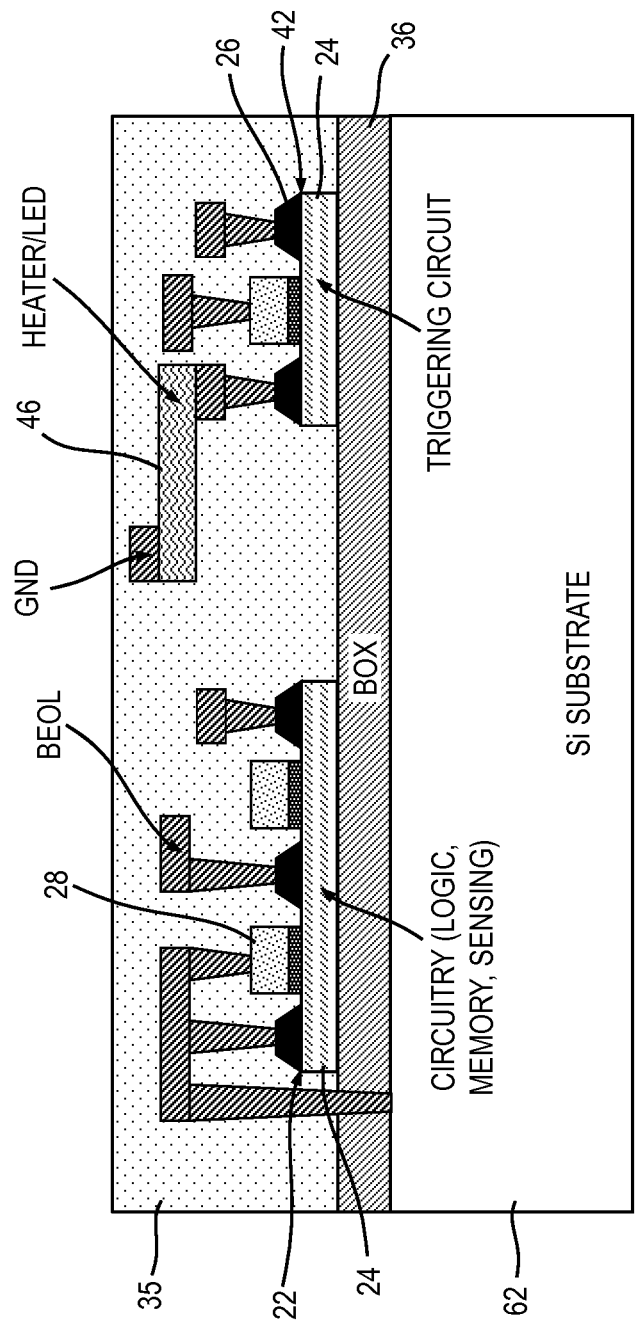

Back end of line (BEOL) processing is shown in FIG. 6 wherein the via conductors 32 and other metal layer(s), including the heating element(s), are formed within the dielectric layer 35. The triggering circuit(s) 42 is electrically connected to the heating element(s) which is, in turn, connected to ground. Additionally or alternatively, the triggering circuit(s) are connected to light emitting elements such as LEDs. Any openings formed in the BOX layer to facilitate etching of the circuit 22 upon formation of acid beneath the BOX layer are filled with appropriate materials at this stage or earlier.

Figure 7:
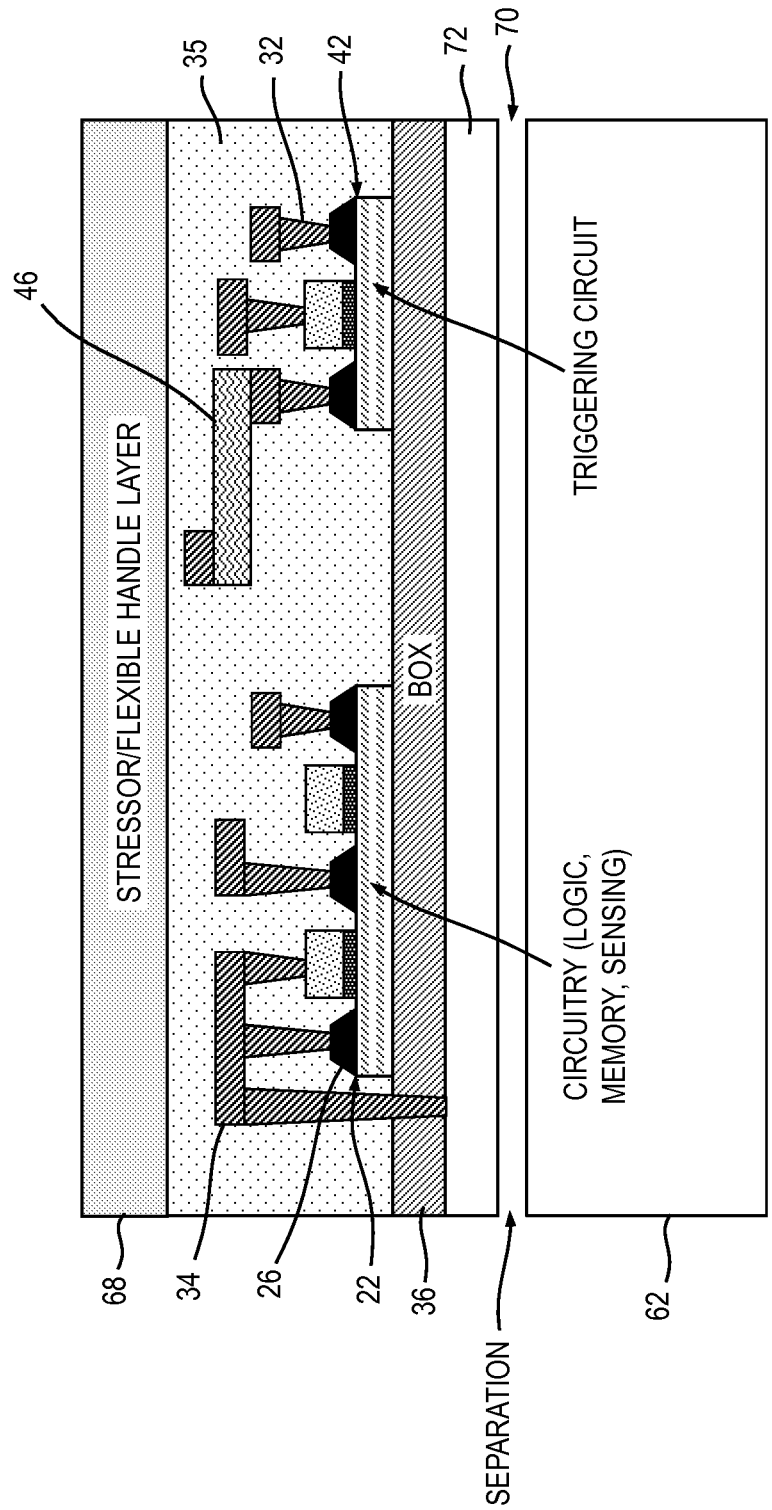
Figure 8:
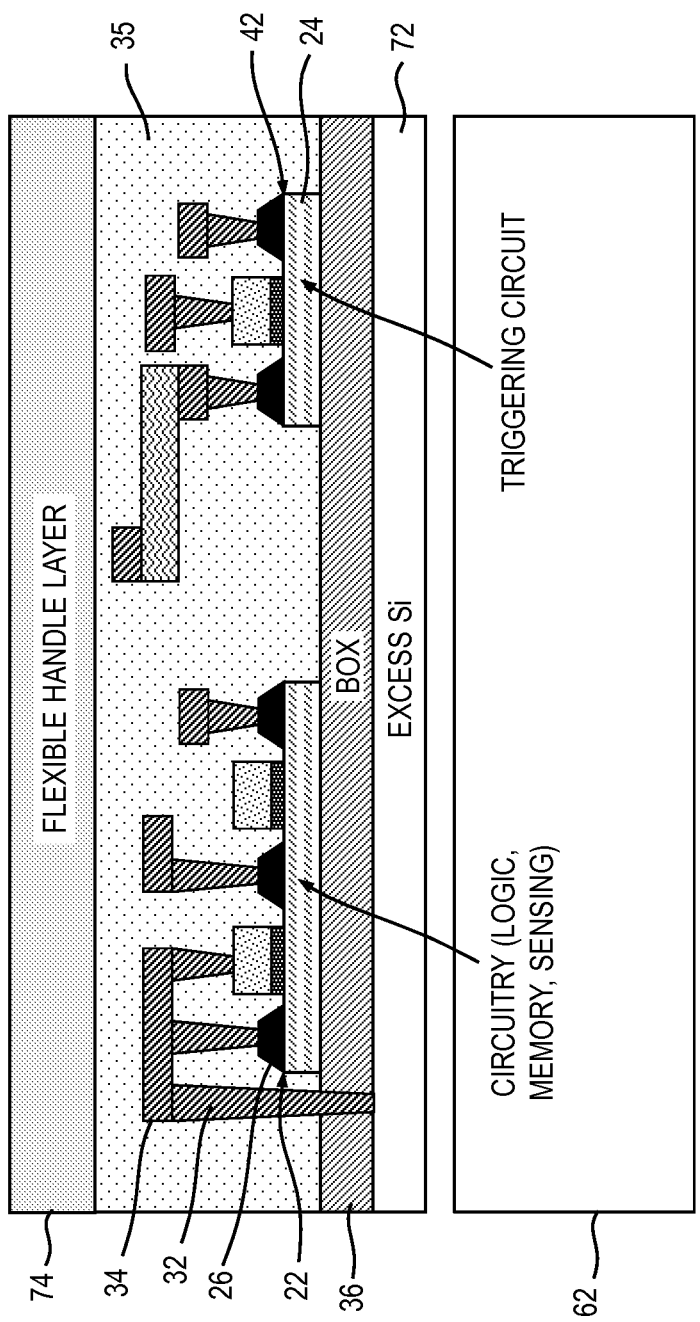

Referring to FIGS. 7 and 8, the structure obtained following BEOL processing is thinned by removing a portion of the substrate 62. One exemplary method for making a thin wafer is shown in FIG. 7. This method involves the attachment of a stressor layer and a flexible handle layer to the substrate, both of which are designated by numeral 68. The process of stress-induced, controlled spalling is described in U.S. Pat. No. 8,247,261, which is incorporated by reference herein. A stress-induced fracture 70 allows the substrate 62 to be separated from the remaining structure, leaving a thin residual substrate layer 72. Alternatively, the substrate 62 is removed by grinding. A flexible handle layer 74, for example polyimide tape, thermal releasable tape, or UV-releasable tape, is attached to the structure prior to grinding, as shown in FIG. 8. The grinding process also leaves a residual substrate layer 72.

Figure 9:
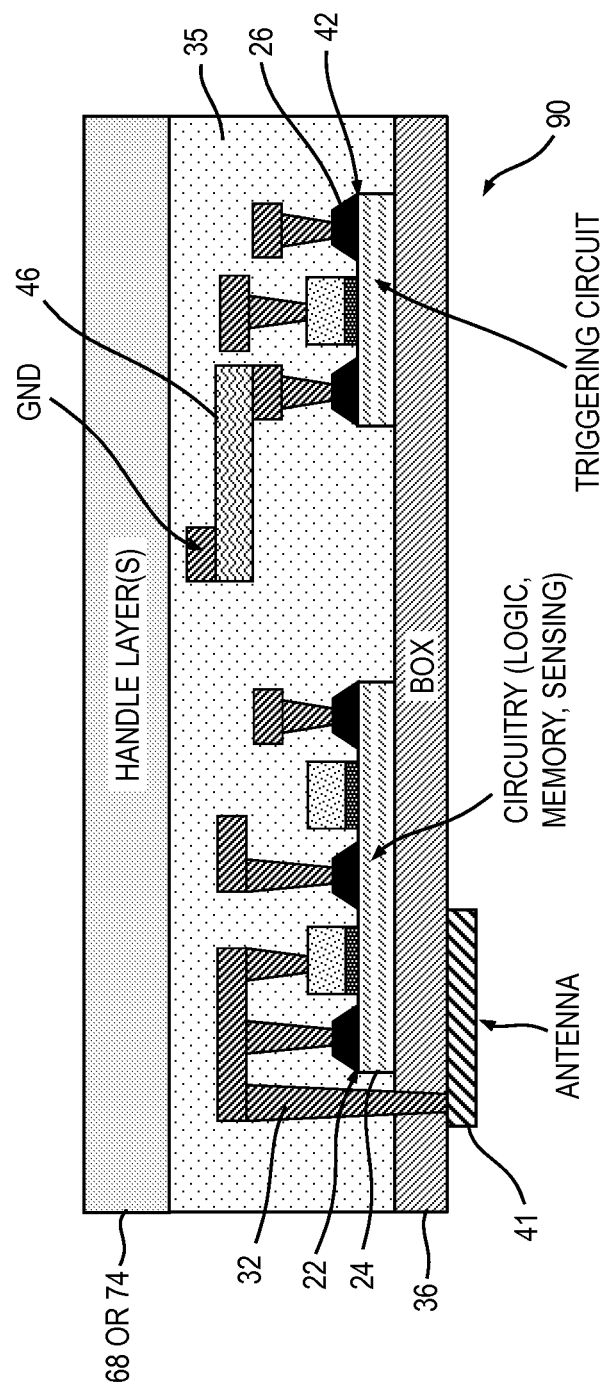

The residual substrate layer 72 is removed by selective etching down to the BOX layer 36. Wet or dry etching techniques may be employed for etching silicon. Potassium hydroxide (KOH) is an exemplary etchant for removing the residual layer 72. The antenna 41 is formed on the exposed surface of the BOX layer 36 by patterning and metal deposition. The structure 90 shown in FIG. 9 is thereby obtained.

Figure 10:
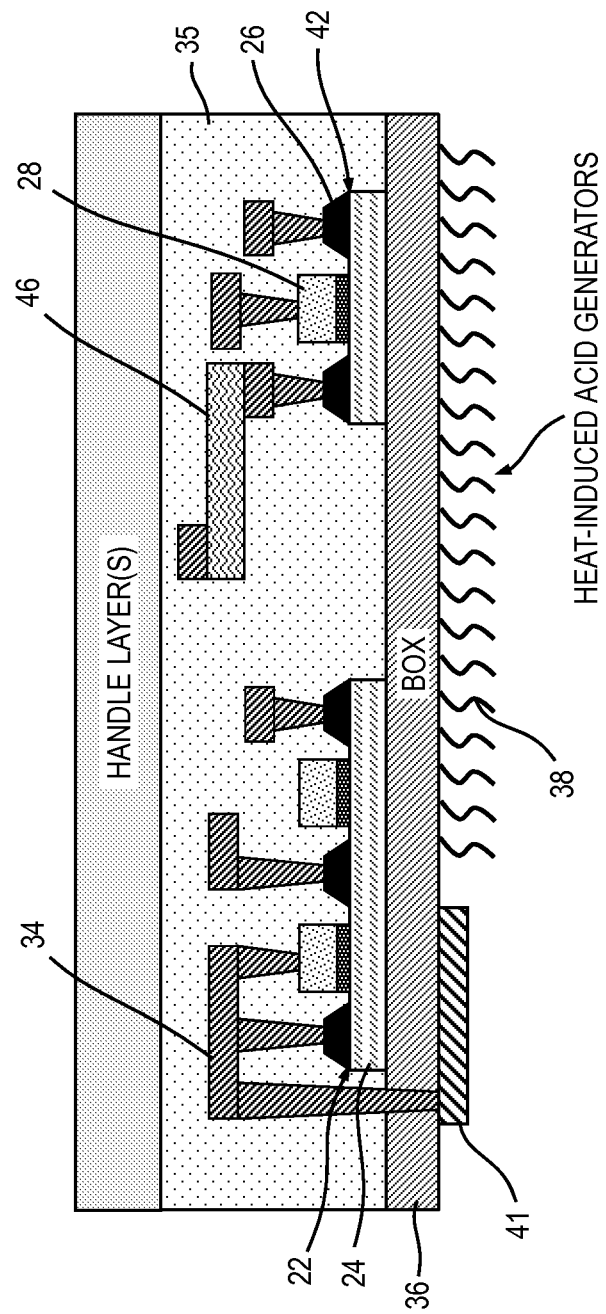

Referring to FIG. 10, the chemical layer 38 is deposited on the exposed surface of the BOX layer 36 by spin coating or other applicable process. The layer is then allowed to dry. The thickness of the deposited layer 38 depends on the amount of material above the BOX layer 36 that is to be attacked. Chemical layer thicknesses between 100 nm-20 μm can be employed in some embodiments. The encapsulation layer 40 is deposited on the structure to obtain the structure 20 shown in FIG. 1. Polydimethylsiloxane (PDMS) is employed in one or more embodiments to form the encapsulation layer and can be deposited by spin coating. Spin-on glass or dissolvable polymeric sheets may alternatively be employed to form the encapsulation layer. If heat induced, acid generating chemicals as described above are employed in the chemical layer 38, they can be wetted prior to encapsulation.

Figure 11:
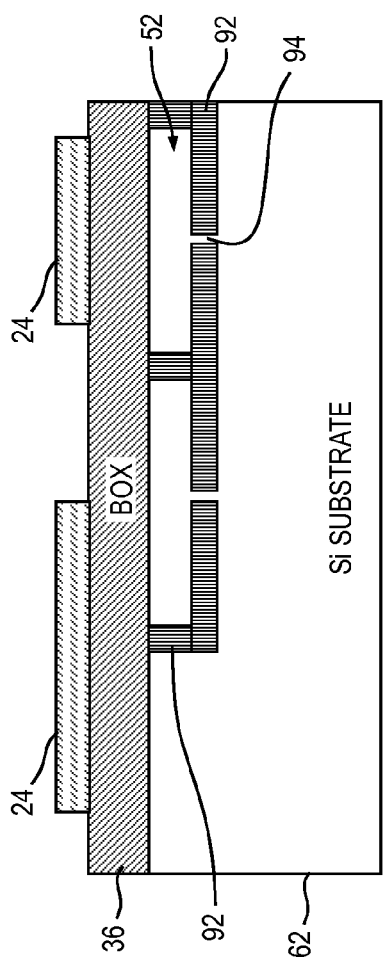
FIGS. 11-15 are schematic sectional views showing exemplary steps for fabricating the second exemplary structure.

Exemplary fabrication steps for producing the structure 50 shown in FIG. 2 are shown in FIGS. 3-4 and 11-15. The description above with respect to FIGS. 3-4 applies to the fabrication of both exemplary structures 20, 50. If, in addition to shattering the chip, etching circuit components with acid is desired, openings and corresponding plugs can be formed within the BOX layer 36, as shown in FIG. 1. Referring to FIG. 11, the compartments 52 are formed in the substrate 62. In one or more exemplary embodiments, the boundaries of the compartments are comprised of the BOX layer and highly doped p+ regions 92 formed in the substrate. Boron doping (1e18-1e21) may be provided at selected areas of the silicon substrate during substrate fabrication or prior to formation of the circuit components. Ion implantation is conducted through a mask. The locations of the regions 92 are determined by the mask and by adjusting the energy of implantation. Formation of doped regions at selected depths within semiconductor substrates is familiar to those of skill in the art. The p+ regions include gaps 94 forming openings to the compartments. The compartments 52 defined by the p+ regions and BOX layer are between 1-5 μm in depth and have widths between 50-100 μm in one or more exemplary embodiments. The gaps 94 are about 5-15 μm.

Figure 12:
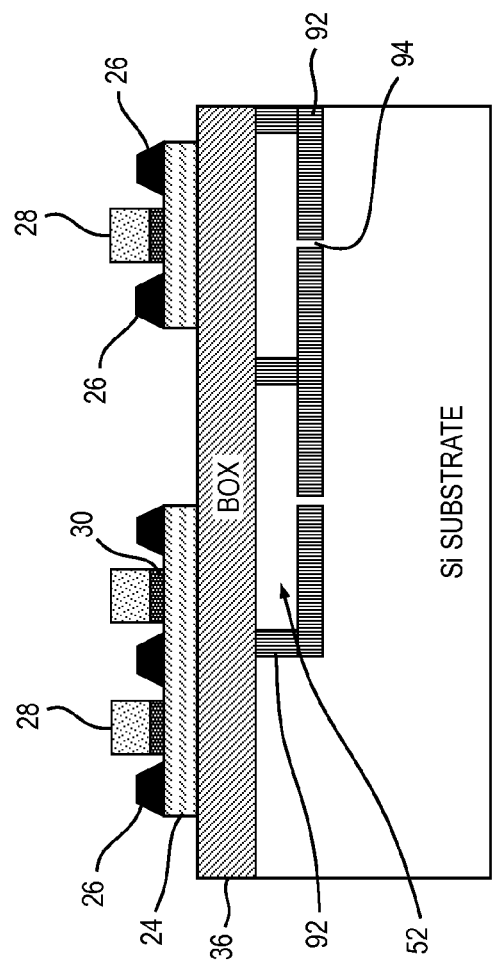
Figure 13:
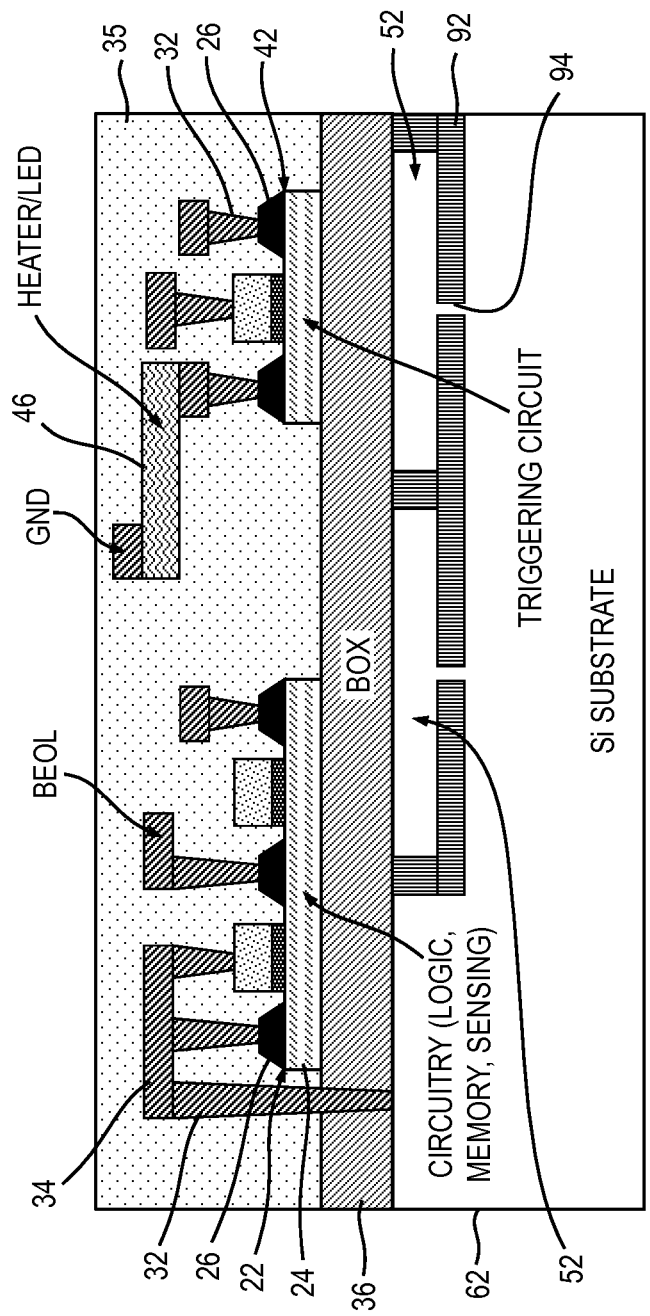

CMOS fabrication techniques as described above are employed to form RSD regions and gate stacks on the semiconductor layer 24 as described above with respect to FIG. 5. The structure shown in FIG. 12 is thereby obtained. This step is followed by back end of line (BEOL) processing as discussed with respect to FIG. 6. The structure shown in FIG. 13 is accordingly obtained. The substrate 62 is then subjected to a thinning process, either by controlled spalling or grinding as discussed above with respect to FIGS. 7 and 8. The compartments 52 should remain intact following either process within the residual silicon layer that adjoins the BOX layer.

Figure 14:
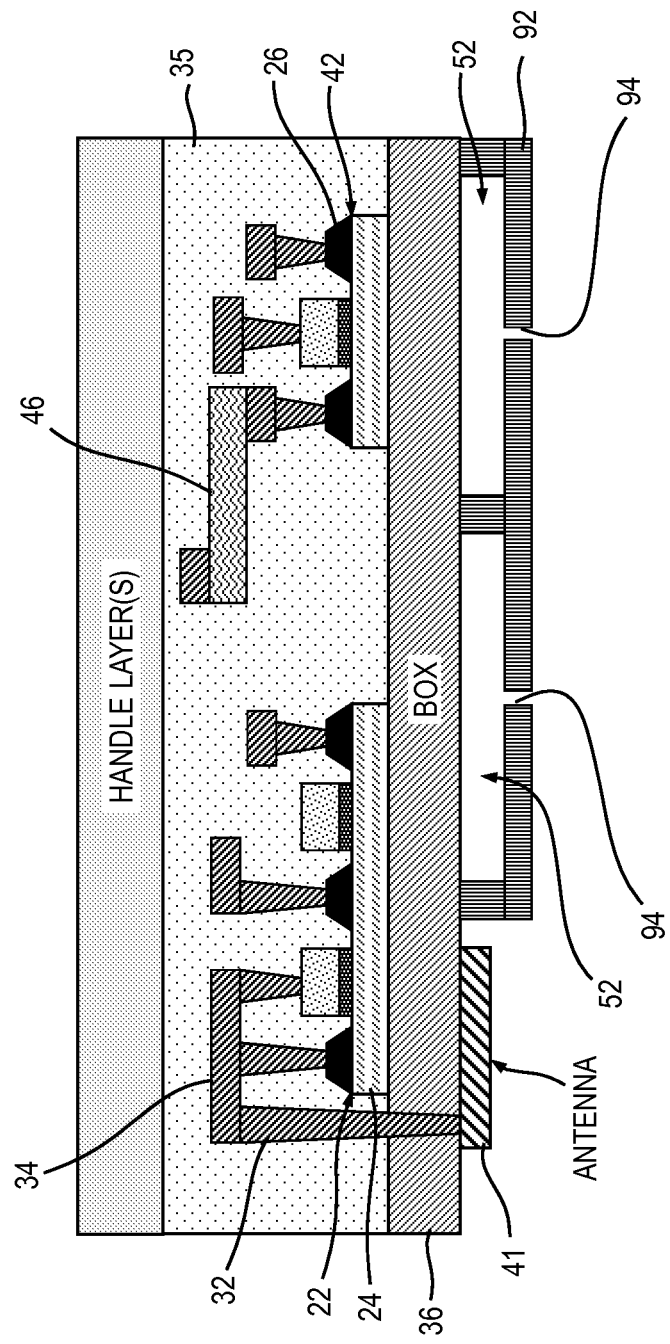
Figure 15:
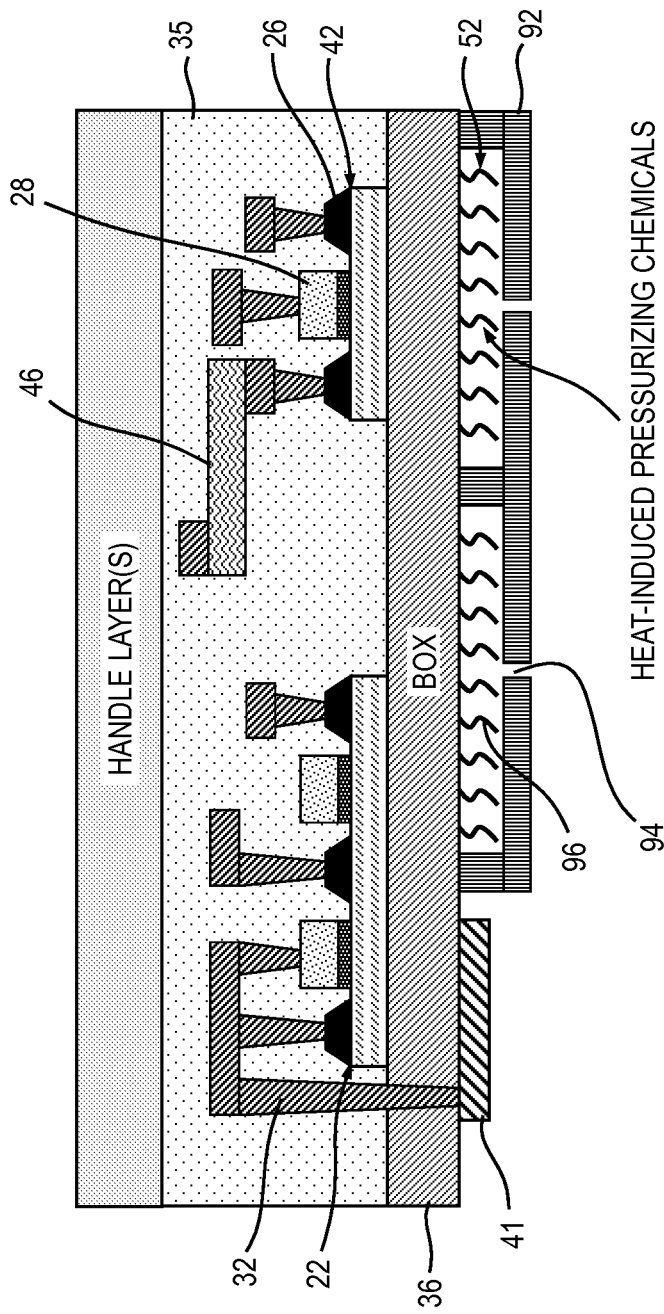

Referring to FIG. 14, the residual silicon layer is removed by a selective etching process. Potassium hydroxide can be employed for etching the silicon, leaving the BOX layer and the highly doped p+ regions forming the compartments substantially intact. An antenna 40 is formed on the exposed BOX layer in some embodiments where the chip includes a transceiver. As discussed above, conventional metallization procedures are employed for forming the antenna(s).

Heat-activated chemicals 96 are applied to the structure, entering the gaps 94 in the p+ regions 92. As discussed above, the composite chemicals employed in the structure 50 are intended to generate gas(es) when activated by, for example, raising the chip temperature sufficiently. Being substantially confined by the compartments 52, pressure builds within the compartments, causing them to rupture. Spin coating may be employed in some embodiments to fill the compartments 52 as completely as possible with gas-generating reactive materials that are stable under normal chip operating temperatures. The composite can be simply deposited on the target surfaces through the spin coating process. The desired thickness of the composite can be controlled by adjusting the viscosity of the composite and the spin speed. The encapsulation layer 40 is deposited on the structure to obtain the structure 50 shown in FIG. 2. Polydimethylsiloxane (PDMS) is employed in one or more embodiments to form the encapsulation layer 40 and can be deposited by spin coating. Spin-on glass or dissolvable/degradable polymeric sheets may alternatively be employed to form the encapsulation layer beneath the insulating layer 36 on the structure.

Given the discussion thus far and with reference to the exemplary embodiments discussed above and in the drawings, it will be appreciated that, in general terms, an exemplary fabrication method includes obtaining a structure including a semiconductor layer 24, an electrically insulating layer 36, and a substrate layer 62, the semiconductor layer comprising silicon and adjoining the insulating layer. Electronic circuitry 22 including a plurality of electrical components is formed on the semiconductor layer. The substrate layer is removed, thereby exposing a bottom surface of the insulating layer. The method further includes depositing a chemically reactive layer 38 in adjoining relation to the bottom surface of the insulating layer. The chemically reactive layer is corrosive to at least one of the electrical components, capable of generating a material corrosive to at least one of the electrical components upon activation, or capable of generating gas upon activation. FIG. 1 shows a structure 20 wherein the reactive layer 38 is either inherently corrosive, such as potassium hydroxide, or capable of generating a material(s) such as one or more acids upon activation as described above. FIG. 2 shows a structure 50 wherein the chemically reactive layer includes chemicals 96 capable of generating gas when activated. An encapsulation layer 40 is formed over the chemically reactive layer. In one or more alternative embodiments, the method includes forming a plurality of compartments 52 within the substrate layer 62 and bounding the insulating layer 36, the chemically reactive layer being deposited within the compartments following removal of the substrate layer, the chemically reactive layer being comprised of gas generating material. The step of forming such compartments within the substrate layer includes forming a plurality of highly doped regions 92 within the substrate layer beneath the insulating layer in one or more embodiments, such as illustrated in FIG. 11. The electronic circuitry comprises CMOS circuitry in one or more embodiments of the method. Further embodiments of the method include the steps of forming a triggering circuit 42 on the semiconductor layer and at least one of a heating element and a light emitting element electrically connected to the triggering circuit. If a heating element is formed, in some embodiments it comprises reactive materials for causing an exothermic reaction. In one or more embodiments, the chemically reactive layer is comprised of acid generating material activated by heat and/or light and capable of producing one or more acids. In accordance with further embodiments, one or more plugs 45 containing sacrificial material extending through the insulating layer are formed, the one or more acids being more corrosive to the sacrificial material than to the insulating layer. Plugs containing sacrificial material can also be formed in embodiments wherein the corrosive material is not an acid.

A structure provided in accordance with the principles expressed herein includes a semiconductor layer 24 comprising silicon and an electrically insulating layer 36 having a top surface and a bottom surface. The semiconductor layer adjoins the top surface of the insulating layer. Electronic circuitry 22 including a plurality of electrical components is on the semiconductor layer of the structure. A chemically reactive layer 38 adjoins the bottom surface of the insulating layer. The chemically reactive layer is corrosive to one or more of the electrical components comprising the electronic circuitry or capable of generating a material corrosive to at least one of the electrical components upon activation. An encapsulation layer 40 is provided over the chemically reactive layer. The electronic circuitry comprises CMOS circuitry in one or more embodiments of the structure. A triggering circuit 42 on the semiconductor layer and a heating element electrically connected to the triggering circuit are provided in further embodiments of the structure. In some embodiments, the heating element is comprised of reactive materials capable of causing an exothermic reaction. A triggering circuit electrically connected to a light emitting element for illuminating the chemically reactive layer is provided in one or more embodiments. The chemically reactive layer 38 includes compositions capable of producing a plurality of acids in some embodiments that allows the targeting of specific materials and/or speeds up the etch rate. One or more plugs 45 comprising sacrificial material extending through the insulating layer 36 are provided in some embodiments. The sacrificial material is corroded more easily than to the insulating layer, thereby facilitating the speed at which the electrical components encounter corrosive material.

A second structure provided in accordance with the principles described herein includes a semiconductor layer 24 comprising silicon and an electrically insulating layer 36 having a top surface and a bottom surface. The semiconductor layer adjoins the top surface of the insulating layer. Electronic circuitry 22 on the semiconductor layer includes a plurality of electrical components. A chemically reactive layer sensitive to temperature and/or light adjoins the bottom surface of the insulating layer, the chemically reactive layer generating gas when activated. One or more compartments adjoin the insulating layer 36, the chemically reactive layer being within the one or more compartments. The structure 50 shown in FIG. 2, which includes material 96 that forms gas upon activation as described in detail above, is exemplary of the second structure. In a further embodiment of the second structure, the chemically reactive layer is sensitive to temperature and a triggering circuit is provided on the semiconductor layer that is electrically connected to a heating element for heating the reactive layer. A triggering circuit 42 is electrically connected to a light emitting element in some embodiments where the chemically reactive layer is sensitive to light.

The exemplary structures as discussed above, if including reactive materials that are light sensitive, may further include a triggering circuit on the semiconductor layer and a light emitting element such as a light emitting diode (LED) electrically connected to the triggering circuit. The LED is configured to emit light having a wavelength that will activate the reactive materials, causing them to generate corrosive materials and/or gases.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A structure comprising:
   a semiconductor layer comprising silicon;
   an electrically insulating layer having a top surface and a bottom surface, the semiconductor layer adjoining the top surface of the insulating layer;
   electronic circuitry including a plurality of electrical components on the semiconductor layer;
   a chemically reactive layer adjoining the bottom surface of the insulating layer, the chemically reactive layer being corrosive to one or more of the electrical components comprising the electronic circuitry or capable of generating a material corrosive to at least one of the electrical components upon activation, and
   an encapsulation layer over the chemically reactive layer, and
   wherein the structure further includes a triggering circuit on the semiconductor layer and at least one of a heating element and a light emitting element electrically connected to the triggering circuit for activating the chemically reactive layer.

2. The structure of claim 1, wherein the electronic circuitry comprises CMOS circuitry.

3. The structure of claim 2, further including a heating element electrically connected to the triggering circuit, the heating element being comprised of reactive materials capable of causing an exothermic reaction for heating the chemically reactive layer.

4. The structure of claim 1, further including a dielectric layer on the insulating layer, the electronic circuitry and a plurality of electrical connectors being embedded within the dielectric layer, the chemically reactive layer being comprised of one or more heat and/or light activated acid generating materials for generating one or more acids corrosive to one or more of the electrical components comprising the electronic circuitry.

5. The structure of claim 4, further including one or more plugs comprising sacrificial material extending through the insulating layer, at least one of the one or more acids being more corrosive to the sacrificial material than to the insulating layer.

6. A structure comprising:
   a semiconductor layer comprising silicon;
   an electrically insulating layer having a top surface and a bottom surface, the semiconductor layer adjoining the top surface of the insulating layer;
   electronic circuitry including a plurality of electrical components on the semiconductor layer;
   a chemically reactive layer sensitive to temperature and/or light adjoining the bottom surface of the insulating layer, the chemically reactive layer generating gas when activated;
   one or more compartments adjoining the insulating layer, the chemically reactive layer being within the one or more compartments, and
   wherein the structure further includes a triggering circuit on the semiconductor layer and at least one of a heating element or a light emitting element electrically connected to the triggering circuit for activating the chemically reactive layer.

7. The structure of claim 6, wherein the electronic circuitry comprises CMOS circuitry.

8. The structure of claim 6, further including the heating element which is comprised of reactive materials capable of causing an exothermic reaction.

9. The structure of claim 6, further including an encapsulation layer, wherein the compartments are comprised of a plurality of highly doped silicon regions adjoining the insulating layer and within the encapsulation layer.

10. The structure of claim 7, wherein the chemically reactive layer is light sensitive, further including a light emitting element electrically connected to the triggering circuit for illuminating the chemically reactive layer.

* * * * *